United States Patent [19]

Nanba et al.

[11] 4,373,975
[45] Feb. 15, 1983

[54] METHOD OF DIFFUSING AN IMPURITY

[75] Inventors: Mitsuo Nanba, Hinondemachi; Masahiko Ogirima, Tokyo; Hirotsugu Kozuka, Sekimachi; Akira Shintani, Hachioji, all of Japan

[73] Assignee: Hitachi, Ltd., Tokyo, Japan

[21] Appl. No.: 228,476

[22] Filed: Jan. 26, 1981

[30] Foreign Application Priority Data

Jan. 30, 1980 [JP] Japan .................................. 55-8809

[51] Int. Cl.³ ........................................ H01L 21/223
[52] U.S. Cl. .................................. 148/189; 148/188; 148/190
[58] Field of Search .................... 148/189, 190, 188

[56] References Cited

U.S. PATENT DOCUMENTS

| 2,898,247 | 8/1959 | Hunter | 148/189 X |
|---|---|---|---|
| 3,041,213 | 6/1962 | Anderson et al. | 148/189 X |
| 3,314,833 | 4/1967 | Arndt et al. | 148/189 |
| 3,320,103 | 5/1967 | Drake et al. | 148/186 X |
| 3,362,858 | 1/1968 | Knopp | 148/189 X |
| 3,530,016 | 9/1970 | Joseph | 148/189 |
| 3,532,564 | 10/1970 | Gittler | 148/189 X |
| 3,841,927 | 10/1974 | Florence et al. | 148/189 |
| 3,907,618 | 9/1975 | Rapp | 148/189 |
| 3,923,563 | 12/1975 | Venkatu | 148/189 |
| 4,040,878 | 8/1977 | Rowe | 148/188 |
| 4,214,918 | 7/1980 | Gat et al. | 148/187 X |
| 4,239,560 | 12/1980 | Chang et al. | 148/190 X |

Primary Examiner—G. Ozaki
Attorney, Agent, or Firm—Antonelli, Terry and Wands

[57] ABSTRACT

Alumina or aluminum is arranged on, or in the vicinity of, a wafer surface into which an impurity, particularly antimony, is to be diffused, and the impurity is vapor-diffused.

The impurity can be diffused in much larger quantities than in a prior art vapor diffusion, and a very low sheet resistance for the diffused layer of antimony can be attained.

25 Claims, 4 Drawing Figures

METHOD OF DIFFUSING AN IMPURITY

BACKGROUND OF THE INVENTION

1. Field of the Invention

This invention relates to a method of diffusing an impurity in the formation of semiconductor materials. More particularly, it relates to a method of diffusing an impurity of high concentration into a semiconductor wafer at high efficiency, the method being especially suitable for the diffusion of a high concentration of antimony.

2. Description of the Prior Art

As is well known, the sealed tube process and the open tube process are usually employed for vapor-diffusing impurities into semiconductor wafers.

The sealed-tube diffusion process is a method in which semiconductor wafers and the source of an impurity to be diffused are contained in a quartz tube and are heated therein. The method can diffuse the impurity uniformly by holding the heating temperature constant. Since, however, a sealed tube is expensive and operations are difficult, the method is scarcely used in semiconductor processes except in cases where the impurity source is highly toxic, where an extremely high uniformity is required of a diffused layer, etc.

On the other hand, the open-tube diffusion process is a method in which semiconductor wafers are placed in a reaction tube opened at both ends and are heated while feeding into the tube a gas containing an impurity. When a substance having a sufficient vapor pressure at the diffusing temperature, for example, phosphorus or boron, is used as the impurity source, it is easy to establish the diffusion controlled state and the uniformity and sheet resistance ($\rho_s$) of a diffused layer obtained are rarely problematic.

However, in a case where an impurity incapable of attaining a sufficiently high vapor pressure at the diffusing temperature, for example, antimony, is diffused, the following problems are liable to occur; the surface impurity concentration of a diffused layer does not become high, and the uniformity of the diffused layer is unsatisfactory.

In the case of diffusing antimony, the surface impurity concentration of the diffused layer is determined by the vapor pressure of antimony on the wafer surface to be formed with the diffused layer. Therefore, when antimony glass is formed on the surface of the wafer and antimony is diffused into the wafer by employing the antimony glass as the impurity source, an impurity diffusion can be carried out that is more stable than a method not using the antimony glass.

For this reason, in diffusing antimony, etc., the method which uses glasses containing antimony, etc., is relied on most extensively. When the contents of antimony, etc., in the glasses are fixed in advance, the quantities of antimony, etc., to be supplied into or arrive into the wafer surfaces are fixed, and hence, the surface impurity concentrations and diffusion depths of diffused layers to be produced by the diffusion treatments are substantially fixed.

Since, however, the method forming the antimony glass on the wafer surface and employing it as the source of the diffusion is extremely complicated in practical use, it is not favorable for the mass production of semiconductor devices, and a more convenient method has been desired.

SUMMARY OF THE INVENTION

An object of this invention is to solve the problems involved in the prior art impurity diffusing methods, and to provide an impurity diffusing method which can very easily diffuse an impurity which is difficult to diffuse, such as antimony, to form a diffused layer or diffused region of high impurity concentration.

In order to accomplish the object, according to this invention, the impurity such as antimony is diffused from its vapor phase under the condition that alumina and/or aluminum exist on, or in the vicinity of, a wafer surface into which the impurity is to be diffused. In practical use, it is the most preferable to carry out the diffusion in the presence of alumina ($Al_2O_3$).

DETAILED DESCRIPTION OF THE PREFERRED EMBODIMENTS

EXAMPLE 1

In this example, the diffusion of antimony was carried out with a plate of a single crystal of sapphire (alumina) opposed to the surface of a wafer.

A first zone of a furnace tube for diffusion (not shown) was held at 750° C., and a second zone at 1,200° C.

Figure 1:
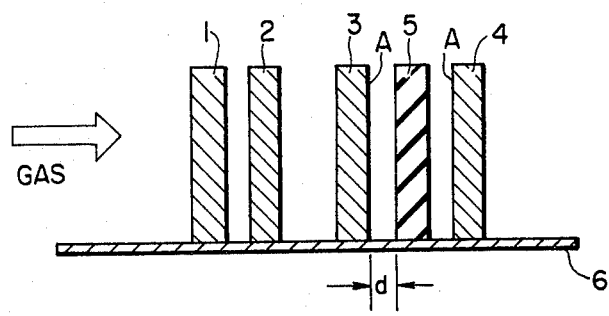
FIG. 1 is a schematic view for illustrating an embodiment of this invention.

In the first zone of the furnace tube, an antimony diffusion source which was constructed by putting $Sb_2O_3$ into a platinum case was situated. In the second zone, as shown in FIG. 1, silicon wafers 1-4 were set upright on a jig 6, and a sapphire plate 5 was arranged at distances d from those surfaces A of the wafers 3 and 4 into which antimony is to be diffused. The sapphire plate 5 used had both its surfaces mirror-finished.

The diffusion of antimony was performed for 45 minutes by employing nitrogen as a carrier gas and under the conditions of a source gas concentration of 0.65 mol-%, a distance d of 4 mm and a temperature of 1,200° C. Then, the sheet resistances of the wafers 1 and 2 not confronting the sapphire plate 5 were approximately 53 $\Omega/\square$; whereas both the sheet resistances of the surfaces A of the wafers 3 and 4 confronting the sapphire plate 5 were 18 $\Omega/\square$. The useable range of a source gas concentration is about from 0.2 to 5.0 mol-%, preferably about from 0.25 to 0.65 mol-%.

It is needless to say that the diffusion for the wafers 1 and 2 was made by the conventional diffusion process. It is, therefore, apparent that the sheet resistance was lowered to about $\frac{1}{3}$ of the value in the conventional process of the prior art by confronting the wafer with the sapphire plate.

That is, according to this invention, a diffused layer having a low sheet resistance, and accordingly a high surface impurity concentration, can be formed even under conditions under which a low sheet resistance cannot be attained with the prior art method. This is effective for the formation of a shallow low-resistance layer, especially for the formation of an antimony-buried layer in a bipolar LSI.

In addition, this invention realizes saturated diffusion in an unsaturated atmosphere. Therefore, it is very effective for lessening the density of diffusion defects called the "antimony flower", the diffusion defects being a problem in the case of forming a diffused layer of high surface impurity concentration by the use of the prior art method.

EXAMPLE 2

The diffusion of antimony was conducted under the same conditions as in Example 1 except that the sapphire single-crystal plate 5 used in Example 1 was replaced with a silicon substrate or a quartz plate on which alumina films 1,000 Å thick were formed by the CVD (chemical vapor deposition).

As a result, the sheet resistances of the wafers 1 and 2 not confronting the alumina film were approximately 58 $\Omega/\square$; whereas both the sheet resistances of the surfaces A of the wafers 3 and 4 confronting the alumina films were 18 $\Omega/\square$. It was noted that a favorable result was similarly obtained with the alumina film which was formed by the CVD.

EXAMPLE 3

The diffusion of antimony was executed under the same conditions as in Example 1 except that the sapphire single-crystal plate 5 used in Example 1 was replaced with aluminum ions at an acceleration voltage of 47 KeV and a dosage of $1 \times 10^{15}/cm^2$.

As a result, the sheet resistances of the wafers 1 and 2 were approximately 60.1 $\Omega/\square$; whereas both the sheet resistances of the surfaces A of the wafers 3 and 4 confronting the silicon implanted with the alumina were 21.7 $\Omega/\square$. It was noted that a result which was somewhat inferior to those in the cases of Examples 1 and 2 employing alumina was obtained but such result was far superior to that in the prior art method, and that the presence of aluminum was also effective for the high concentration diffusion of antimony.

EXAMPLE 4

The diffusion of antimony was carried out under the same conditions as in Example 1, except that a silicon plate or a quartz plate whose surfaces were lapped with Alumina Abrasive No. 600, No. 1500 or No. 2000 was used instead of the sapphire single-crystal plate 5 in Example 1.

As a result, the sheet resistances of the wafers 1 and 2 were approximately 58 $\Omega/\square$; whereas the sheet resistances of the surfaces A of the wafers 3 and 4 confronting the surfaces of the silicon plate or the quartz plate lapped with the alumina abrasive were approximately 19.1 $\Omega/\square$. An effect substantially equal to those of Examples 1 and 2 employing the sapphire single-crystal substrate, etc., was noted.

Regarding the effect in this case, it is considered that the alumina abrasive will enter minute scratches caused by the lapping and will act effectively on the diffusion of antimony. Therefore, it is necessary that some alumina is retained on the lapped surface.

Figure 2:
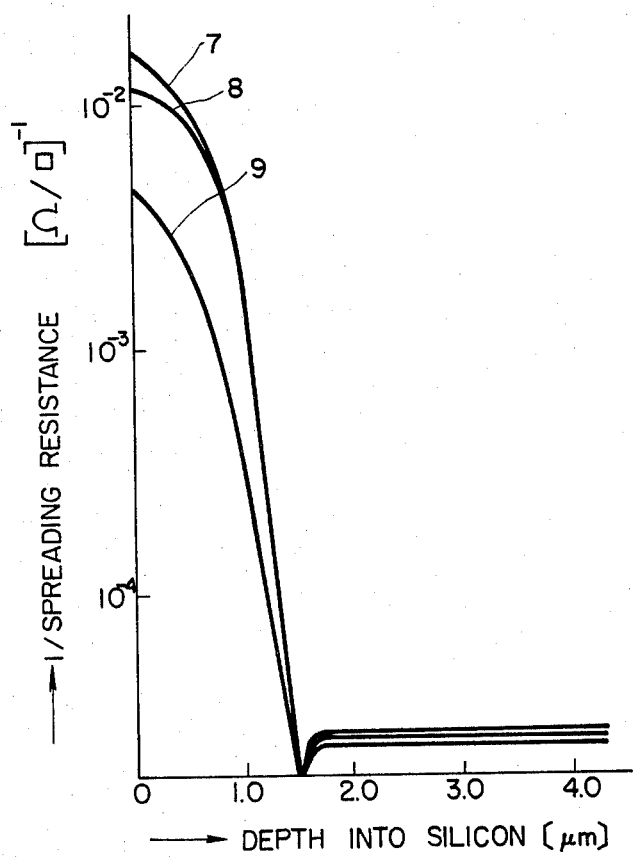
FIGS. 2 and 3 are graphs each illustrating an effect of this invention.

FIG. 2 shows the relationship between the depth of diffusion of antimony into a wafer taken from the surface thereof and the inverse number of the spreading resistance. Curves 7, 8 and 9 indicate results obtained in the case where a sapphire single-crystal plate was held confronting the wafer, in the case where a silicon plate lapped with Alumina Abrasive No. 1500 was held confronting the wafer, and in the case of the prior art method (i.e. without the alumina), respectively.

As understood by comparing the curves 7 and 8 with the curve 9, according to this invention, antimony-diffused layers whose impurity concentrations are about 3 times higher than with the prior art method are formed.

The reason why, or the mechanism by which, antimony is diffused at high concentration in the presence of aluminum or alumina is not clear. However, quite no effect was noted when the lapping with the alumina abrasive was substituted by a lapping with SiC, a sandblasting or a grinding with diamond, and a plate thus processed was held confronting the wafers.

On the other hand, whether a material to be abraded with alumina was a quartz plate or a single-crystal silicon plate, and whether the surfaces of the plate were finished into a roughened surface or mirror surface, the abraded plate was effective for the diffusion of antimony. When the particle size of the alumina abrasive was varied, the effects were noted in all cases.

However, when $Si_3N_4$ was deposited by the CVD onto the surfaces lapped with alumina, in a manner to cover the surfaces, the effect on the antimony diffusion was fully lost.

From these results and the foregoing examples, it has been verified that the presence of alumina or aluminum is very effective for the high concentration diffusion of antimony into a substrate.

In Example 3, the silicon plate in which aluminum was ion-implanted was held confronting the wafers in carrying out the diffusion of antimony. In this case, at least part of the implanted aluminum might have become alumina for such as reasons that the silicon plate was held at the high temperature for the antimony diffusion and that $Sb_2O_3$ was used as the impurity source.

It is, accordingly, unclear whether only alumina participates in the high concentration diffusion of antimony and acts effectively or whether aluminum is also effective.

In this regard, however, in cases where favorable results were obtained by arranging alumina in the vicinity of the surface into which antimony was to be diffused, favorable results were similarly obtained by arranging aluminum and performing the diffusion.

From the standpoint of practical use, obviously alumina, which has a high melting point and which is chemically stable, is more preferable in almost all respects than aluminum, which has a low melting point. Consequently, alumina is used in most cases.

The ground or mechanism on which the high concentration diffusion of antimony is achieved by the existence of alumina or aluminum in the vicinity of the wafers is not clear. It is conjectured, however, that the change from $Sb_2O_3$ into the elemental antimony will be promoted by the catalytic action of alumina or aluminum and that the element of antimony will be diffused into the vicinal wafer surfaces at a high surface impurity concentration by the outdiffusion.

As apparent from FIG. 2, no difference was noted between this invention and the prior art method as regards the depths of the antimony diffused layers, and it has been revealed that aluminum is not considered to be diffused into the wafers appreciably.

EXAMPLE 5

In the diffusion described in Example 4, a very small amount of oxygen was added into the nitrogen being used as the carrier gas, and the diffusion of antimony was executed at 1,200° C. for 30 minutes. At a source gas concentration of 0.42–0.46 mol-% and a distance d of 2 mm, the content of the oxygen in the nitrogen gas was varied and had its influence investigated.

As a result, even when the $O_2/(N_2+O_2)$ ratio was changed to be 0%, 1%, 2% and 4%, the sheet resistances of the wafers 1 and 2 were approximately 67 $\Omega/\square$ in all the cases and hardly changed.

In contrast, the sheet resistances of the wafers 3 and 4 in the case of this invention became 25, 32, 38 and 60 $\Omega/\square$ at the respective ratios, and the resistances gradually increased as the $O_2$ content increased. It is, accordingly, possible to control the value of the sheet resistance to a desired value by varying the magnitude of $O_2/(N_2+O_2)$. The reason why the sheet resistance rises with the increase of the oxygen content is believed to be that the antimony element which ought to penetrate into the wafer, owing to the outdiffusion, will be oxidized into $Sb_2O_3$ or $Sb_2O_5$ and will become incapable of contributing to the diffusion into the wafer.

EXAMPLE 6

Figure 3:
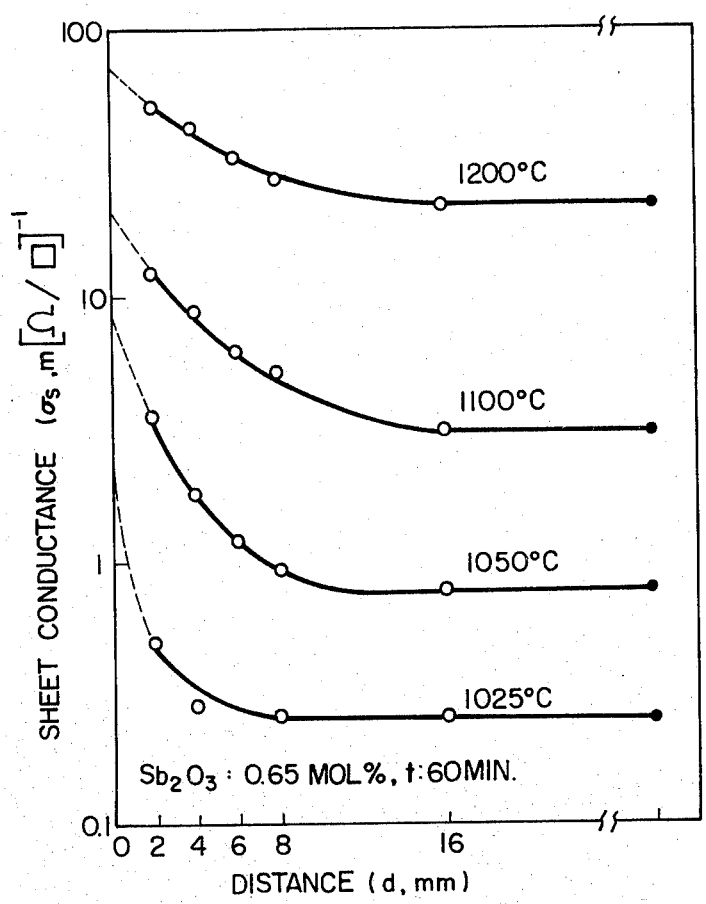

FIG. 3 illustrates the relationship in Example 4 between the distances d between the wafers 3, 4 and the substrate 5 with the surfaces of the silicon plate lapped by Alumina Abrasive No. 1500 and the sheet conductance (the inverse number of the sheet resistance) attained, with the diffusing temperature a parameter.

The content of $Sb_2O_3$ in the carrier gas was 0.65 mol-%, and the diffusing period of time was 60 minutes. In FIG. 3, marks ○ indicate results according to this invention, and marks ● indicate results according to the prior art method for comparison's sake. Similar effects as shown in FIG. 3 were obtained at the diffusion temperature of 1,250 and 1,300° C.

As apparent from FIG. 3, when the distance between the wafer and the alumina-lapped plate is small, the sheet conductance of the wafer becomes remarkably high. Since such small distances are very effective for the high concentration diffusion of antimony, the smallest possible distance d is recommended.

When the distance d is about 8–10 mm or greater, the effect owing to confronting the wafer with the plate lapped by alumina decreases drastically, and the sheet conductance attained becomes scarcely different from that realized by the prior art method. Therefore, such great distances d ought to be avoided. The useable range for d is about from 1 to 8 or 10 mm, preferably about from 2 to 4 mm.

EXAMPLE 7

In the foregoing examples, the vapor diffusion of antimony was carried out by arranging alumina or aluminum in the vicinity of the surfaces of the wafers.

However, alumina or aluminum need not be arranged in the vicinity of the wafer surfaces, but it may well exist directly on the wafer surface.

Figure 4:
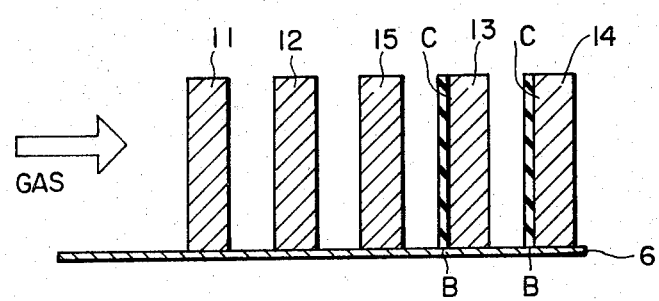
FIG. 4 is a schematic view for illustrating another embodiment of this invention.

Using the apparatus employed in Example 1, silicon wafers 11, 12, 13, 14 and 15 were erected upright on a susceptor 6 as shown in FIG. 4, and the diffusion of antimony was conducted likewise to Example 1.

An alumina film B having a thickness of 500–1,000 Å was deposited by the CVD on one surface of each of the wafers 13 and 14 in advance. The wafer 15 was a dummy wafer for confirming the effect of the alumina film B.

As a result, the sheet resistances of the wafers 11 and 12 were approximately 53 $\Omega/\square$, and both the sheet resistances of the surfaces C of the wafers 13 and 14 were 33.5 $\Omega/\square$. It has, accordingly, been noted that the sheet resistance is lowered to approximately 1/1.7 by the deposition of the alumina film.

EXAMPLE 8

On the surface of a wafer, an alumina film was formed by forming an aluminum film on the wafer surface in a low pressure by vacuum evaporation and treating the resultant wafer in boiling water so as to oxidize the aluminum film.

The wafer formed with the alumina film was subjected to the diffusion of antimony likewise to Example 7, with the result that the sheet resistance became 24.5 $\Omega/\square$. Thus, the diffusion at a concentration approximately 2.2 times as high as in the prior art was achieved.

EXAMPLE 9

An alumina film 10–20 Å thick was deposited on the surface of a wafer by the use of a conventional radio-frequency sputtering equipment, and the diffusion of antimony was conducted under the same conditions as in Example 7. The sheet resistance of a diffused layer obtained was approximately 23.5 $\Omega/\square$, and the diffusion at a concentration approximately 2.3 times as high as in the prior art method was achieved.

EXAMPLE 10

75 (Seventy-five) wafers were arranged in a lateral reaction tube, and while heating them, a mixed gas consisting of triisobutyl aluminum (($i$-$C_4H_9$)Al) and oxygen was introduced into the reaction tube. Thus, alumina films were formed on the surfaces of the wafers. Thereafter, the diffusion of antimony was carried out under the same conditions as in Example 7.

As a result, the mean value of the sheet resistances of diffused layers formed was 24.2 $\Omega/\square$, the maximum value was 27 $\Omega/\square$ and the standard deviation was 1.2 $\Omega/\square$. It has, accordingly, been noted that the treated wafers can be satisfactorily put into practical use.

As the source for depositing the alumina films, not only ($i$-$C_4H_9$)Al mentioned above, but also Al(OC$_3$H$_2$)$_3$, Al(OC$_2$H$_5$)$_3$, Al(CH$_3$)$_3$, AlCl$_3$, Al($i$-$C_4H_3$)$_3$, etc. can be used.

As set forth above, according to this invention, antimony is vapor-diffused in the presence of alumina or aluminum on, or in the vicinity of, a wafer surface in which a diffused layer is to be formed. Thus, diffusion of antimony at a concentration much higher than in the prior art is achieved, and it is greatly advantageous in fabricating semiconductor devices. While, in each of the foregoing examples, alumina or aluminum was used alone, the diffusion may, of course, be carried out in the coexistence of both alumina and aluminum.

Furthermore, while in each of the examples mentioned above, alumina was used alone, it is also clear that the effect may, of course, be attained using at least one compound containing $Al_2O_3$, for example $Al_2O_3$-$SiO_2$, $Al_2O_3$-$SiO_2$-$Y_2O_3$, $Al_2O_3$-$SiO_2$-$La_2O_3$, $Al_2O_3$-$SiO_2$-$ZrO_2$ and others.

What is claimed is:

1. A method of diffusing antimony in the formation of a semiconductor device comprising the step of arranging alumina and/or aluminum in the vicinity of a wafer surface in which an antimony diffused layer is to be formed, and the step of diffusing antimony from its vapor phase, said antimony being diffused with no appreciable diffusion of aluminum.

2. A method of diffusing antimony as defined in claim 1, wherein a distance between said alumina and/or aluminum and said wafer surface in which an antimony-diffused layer is to be formed is not more than approximately 8 to 10 mm.

3. A method of diffusing antimony as defined in claim 2, wherein the diffusion is carried out by positioning said wafer surface opposite to a sapphire plate.

4. A method of diffusing antimony as defined in claim 2, wherein the diffusion is carried out by positioning said wafer surface opposite to a silicon plate or a quartz plate with a surface facing said wafer and having an alumina film or an aluminum film deposited thereon.

5. A method of diffusing antimony as defined in claim 2, wherein the diffusion is carried out by positioning said wafer surface opposite to a silicon plate in which aluminum is implanted.

6. A method of diffusing antimony as defined in claim 2, wherein the diffusion is carried out by positioning said wafer surface opposite to a surface of a silicon plate or a quartz plate which is abraded with an alumina abrasive.

7. A method of diffusing antimony as defined in claim 2, wherein the diffusion is carried out after oxidizing an aluminum film deposited on said wafer surface.

8. A method of diffusing antimony as defined in claim 2, wherein the diffusion is carried out after forming the alumina on said wafer surface by sputtering or chemical vapor deposition.

9. A method of diffusing antimony as defined in claim 1 or 2, wherein said alumina and/or aluminum does not have incorporated therewith antimony.

10. A method of diffusing antimony as defined in claim 1 or 2, wherein the step of diffusing antimony takes place in an open tube.

11. A method of diffusing antimony as defined in claim 1 or 2, wherein the alumina and/or aluminum are arranged in the vicinity of a wafer surface in a second zone of a furnace tube, with an antimony diffusion source being positioned in a first zone of said furnace tube.

12. A method of diffusing antimony as defined in claim 2, wherein said distance is not more than approximately 8 mm.

13. A method of diffusing antimony as defined in claim 2, wherein said distance is between approximately 1–10 mm.

14. A method of diffusing antimony as defined in claim 13, wherein said distance is between approximately 1–8 mm.

15. A method of diffusing antimony as defined in claim 13, wherein said distance is 2–4 mm.

16. A method of diffusing antimony as defined in claim 1, wherein the diffusion is carried out by positioning said wafer surface opposite to a sapphire plate.

17. A method of diffusing antimony as defined in claim 1, wherein the diffusion is carried out by positioning said wafer surface opposite to a silicon plate or a quartz plate with a surface facing said wafer and having an alumina film or an aluminum film deposited thereon.

18. A method of diffusing antimony as defined in claim 1, wherein the diffusion is carried out by positioning said wafer surface opposite to a silicon plate in which aluminum is implanted.

19. A method of diffusing antimony as defined in claim 1, wherein the diffusion is carried out by positioning said wafer surface opposite to a surface of a silicon plate or a quartz plate which is abraded with an alumina abrasive.

20. A method of diffusing antimony as defined in claim 1, wherein the diffusion is carried out after oxidizing an aluminum film deposited on said wafer surface.

21. A method of diffusing antimony as defined in claim 1, wherein the diffusion is carried out after forming the alumina on said wafer surface by sputtering or chemical vapor deposition.

22. A method of diffusing antimony as defined in claim 21, wherein the alumina is formed on said wafer surface by introducing a mixed gas comprising oxygen and a gas selected from the group consisting of (i-$C_4H_9$)Al, Al($OC_3H_2$)$_3$, Al($OC_2H_5$)$_3$, Al($CH_3$)$_3$, $AlCl_3$ and Al(i-$C_4H_3$)$_3$ to said wafer surface and heating the wafers, whereby alumina films are formed on the wafer surface.

23. A method of diffusing antimony as defined in claim 1, wherein the diffusion is carried out by arranging a compound containing alumina adjacent to said surface.

24. A method of diffusing antimony as defined in claim 23, wherein said compound is at least one selected from the group consisting of $Al_2O_3$-$SiO_2$, $Al_2O_3$-$SiO_2$-$La_2O_3$ and $Al_2O_3$-$SiO_2$-$ZrO_2$.

25. A method of diffusing antimony as defined in claim 1, wherein the diffusion of antimony is effected by using nitrogen as a carrier gas and an antimony diffusion source comprising antimony oxide in a furnace tube maintained at a temperature ranging from 1,025° to 1,300° C.

* * * * *